United States Patent
Farnworth

(10) Patent No.: US 7,138,334 B2
(45) Date of Patent: Nov. 21, 2006

(54) SYSTEMS FOR FORMING INSULATIVE COATINGS FOR VIA HOLES IN SEMICONDUCTOR DEVICES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/212,226

(22) Filed: Aug. 25, 2005

(65) Prior Publication Data
US 2005/0282383 A1 Dec. 22, 2005

Related U.S. Application Data

(62) Division of application No. 10/663,944, filed on Sep. 16, 2003, now Pat. No. 6,984,583.

(51) Int. Cl.
H01L 21/4763 (2006.01)
H01L 21/44 (2006.01)
H01L 21/302 (2006.01)
H01L 21/461 (2006.01)

(52) U.S. Cl. .................. 438/637; 438/640; 438/667; 438/761

(58) Field of Classification Search ........... 438/637, 438/640, 667, 761
See application file for complete search history.

(56) References Cited

U.S. PATENT DOCUMENTS 5,208,068 A * 5/1993 Davis et al. ............ 427/96.9
6,251,488 B1 6/2001 Miller et al.
6,259,962 B1 7/2001 Gothait
6,268,584 B1 7/2001 Keicher et al.
6,391,251 B1 5/2002 Keicher et al.
6,903,443 B1 6/2005 Farnworth et al.
2002/0171177 A1 11/2002 Kritchman et al.
2003/0102566 A1 6/2003 Farnworth
2003/0151167 A1 8/2003 Kritchman et al.
2004/0443607 3/2004 Farnworth et al.
2004/0112881 A1 6/2004 Bloemeke et al.

FOREIGN PATENT DOCUMENTS

JP 04-024987 1/1992

OTHER PUBLICATIONS

Miller et al., "Maskless Mesoscale Materials Deposition," Deposition Technology, Sep. 2001, pp. 20-22.
Miller, "New Laser-Directed Deosition Technology," Microelectronic Fabrication, Aug. 2001, p. 16.
Webpage, Objet Prototyping the Future, "Objet FullCure700 Series," 4 pages (2003-2004).
Webpage, Objet Prototyping the Future, "How it Works," 2 pages (2003).

* cited by examiner

Primary Examiner—William M. Brewster
(74) Attorney, Agent, or Firm—TraskBritt

(57) ABSTRACT

An insulative coating for an aperture of a semiconductor device component includes a plurality of adjacent, mutually adhered regions. The adjacent, mutually adhered regions may be formed by programmed material consolidation processes, such as stereolithography. Such an insulative coating may electrically isolate conductive features, such as conductive vias, from the substrate of a semiconductor device component.

13 Claims, 7 Drawing Sheets

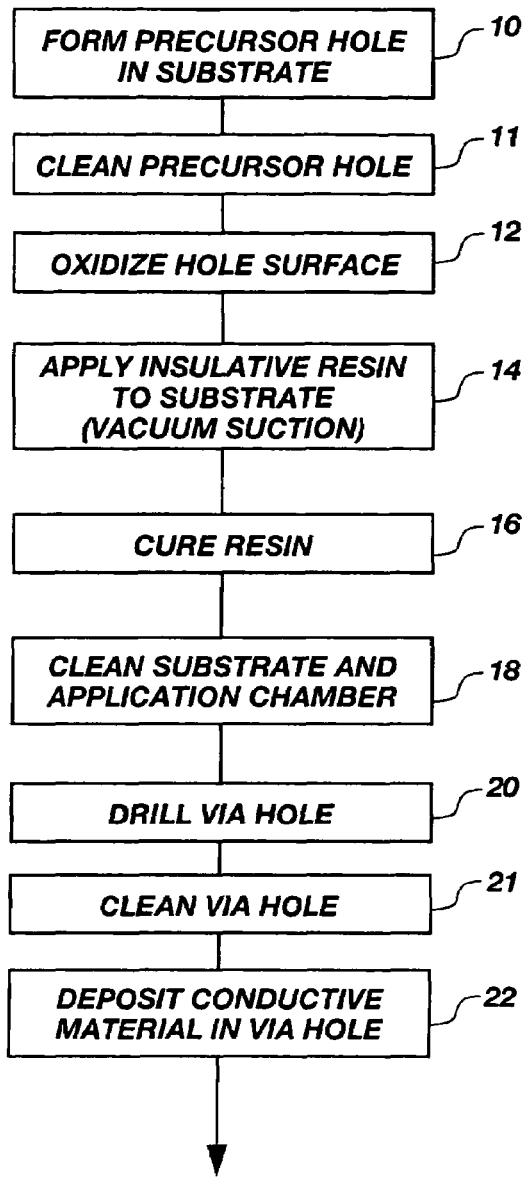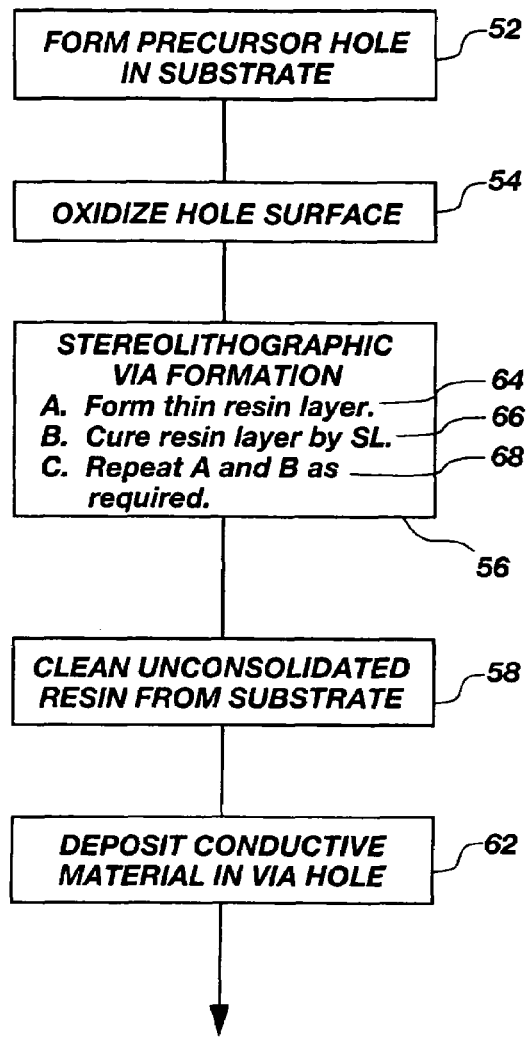
FIG. 1
(PRIOR ART)
FIG. 2

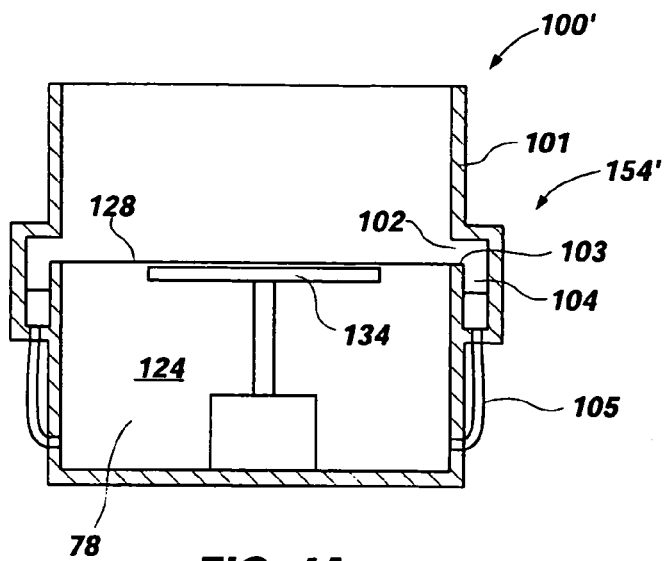
FIG. 4A
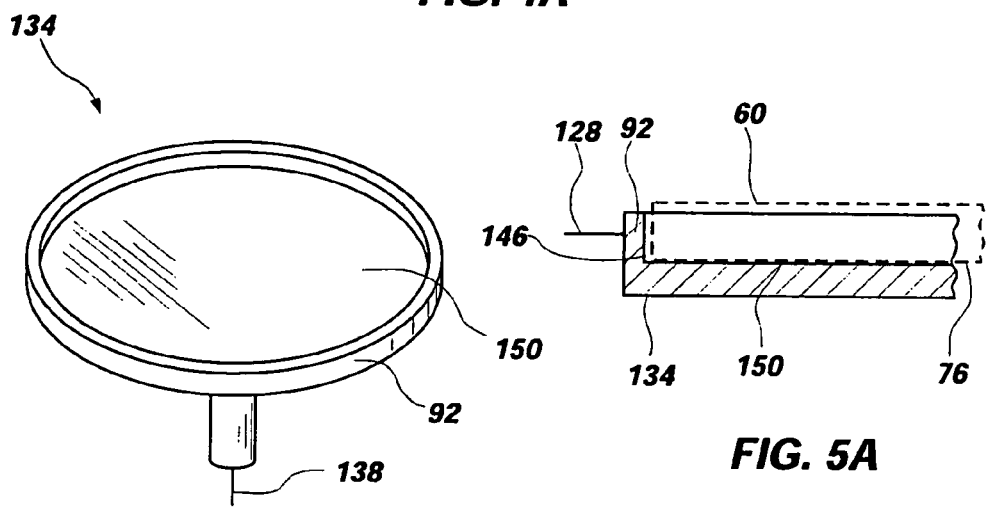
FIG. 5
FIG. 5A
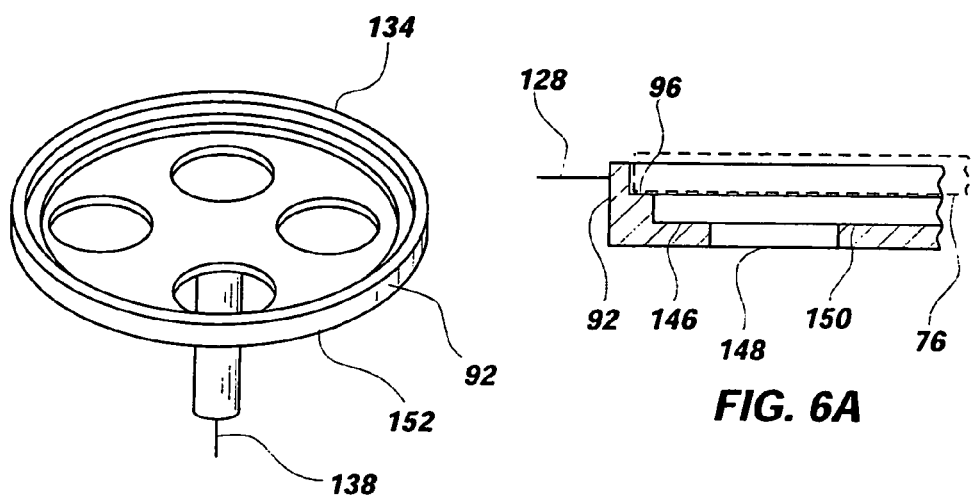
FIG. 6
FIG. 6A

SYSTEMS FOR FORMING INSULATIVE COATINGS FOR VIA HOLES IN SEMICONDUCTOR DEVICES

CROSS-REFERENCE TO RELATED APPLICATION

This application is a divisional of application Ser. No. 10/663,944, filed Sep. 16, 2003, now U.S. Pat. No. 6,984,583 issued Jan. 10, 2006.

BACKGROUND OF THE INVENTION

1. Field of the Invention

The present invention relates generally to processes and methods for forming electronic devices and the like. More particularly, the present invention pertains to methods and apparatus for effecting the creation of via holes in semiconductors and other thin substrates and, more specifically, to methods and apparatus for forming insulative coatings of via holes. The present invention also pertains to the use of stereolithography techniques to form insulative coatings with small diameter via holes extending therethrough.

2. Background of Related Art

Over the past decade or so, a manufacturing technique which has become known as "stereolithography" and which is also known as "layered manufacturing" has evolved to a degree where it is employed in many industries.

Basically, stereolithography, as conventionally practiced, involves utilizing a computer, typically under control of three-dimensional (3-D) computer-aided design (CAD) software, to generate a 3-D mathematical simulation or model of an object to be fabricated. The computer mathematically separates or "slices" the simulation or model into a large number of relatively thin, parallel, usually vertically superimposed layers. Each layer has defined boundaries and other features that correspond to a substantially planar section of the simulation or model and, thus, of the actual object to be fabricated. A complete assembly or stack of all of the layers defines the entire simulation or model. A simulation or model which has been manipulated in this manner is typically stored and, thus, embodied as a CAD computer file. The simulation or model is then employed to fabricate an actual physical object by building the object, layer by superimposed layer. Surface resolution of the fabricated object is, in part, dependent upon the thickness of the layers.

A wide variety of approaches to stereolithography by different companies has resulted in techniques for fabricating objects from various types of materials. Regardless of the material employed to fabricate an object, stereolithographic techniques usually involve disposition of a layer of unconsolidated or unfixed material corresponding to each layer of the simulation or model. Next, the material of a layer is selectively consolidated or fixed to at least a partially consolidated, partially fixed, or semisolid state in those areas of a given layer that correspond to solid areas of the corresponding section of the simulation or model. Also, while the material of a layer is being consolidated or fixed, that layer may be bonded to a lower layer of the object which is being fabricated.

The unconsolidated material employed to build an object may be supplied in particulate or liquid form. The material may itself be consolidated or fixed. Alternatively, when the unconsolidated material comprises particles, a separate binder material mixed therein or coating the particles may facilitate bonding of the particles to one another, as well as to the particles of a previously formed layer.

Surface resolution of the features of a fabricated object depends, at least in part, upon the material being used. For example, when particulate materials are employed, resolution of object surfaces is highly dependent upon particle size, whereas when a liquid is employed, surface resolution is highly dependent upon the minimum surface area of the liquid which can be consolidated or fixed and the minimum thickness of a material layer that can be generated. Of course, in either case, resolution and accuracy of the features of an object being produced from the simulation or model is also dependent upon the ability of the apparatus used to consolidate or fix the material to precisely track the mathematical instructions indicating solid areas and boundaries for each layer of material.

Toward that end, and depending upon the type and form of material to be fixed, stereolithographic fabrication processes have employed various fixation approaches. For example, particles have been selectively consolidated by particle bombardment (e.g., with electron beams), disposition of a binder or other fixative in a manner similar to ink-jet printing techniques, and focused irradiation using heat or specific wavelength ranges. In some instances, thin, preformed sheets of material may be superimposed to build an object, each sheet being fixed to a next lower sheet and unwanted portions of each sheet removed, a stack of such sheets defining the completed object.

Early on in its development, stereolithography was used to rapidly fabricate prototypes of objects from CAD files. Prototypes of objects might be built to verify the accuracy of the CAD file defining the object (e.g., an object or negative of a mold to be machined) and to detect any design deficiencies and possible fabrication problems before a design was committed to large-scale production. Stereolithographic techniques have also been used in the fabrication of molds. Using stereolithographic techniques, either male or female forms on which mold material might be disposed could be rapidly generated.

In more recent years, stereolithography has been employed to develop and refine object designs in relatively inexpensive materials. Stereolithography has also been used to fabricate small quantities of objects for which the cost of conventional fabrication techniques is prohibitive, such as in the case of plastic objects that have conventionally been formed by injection molding techniques. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

Conventionally, stereolithographic apparatus have been used to fabricate freestanding structures. Such structures have been formed directly on a platen or other support system of the stereolithographic fabrication apparatus, which is located within the fabrication tank of the stereolithographic apparatus. As the freestanding structures are fabricated directly on the support system, there is typically no need to precisely and accurately position features of the stereolithographically fabricated structure. As such, conventional stereolithographic apparatus lack machine vision systems for ensuring that structures are fabricated at certain locations.

Moreover, conventional stereolithographic apparatus lack support systems, handling systems, and cleaning equipment which are suitable for use with relatively delicate structures, such as semiconductor substrates and semiconductor devices that have been fabricated thereon.

Recently, improved stereolithographic apparatus have been configured to form structures on fabrication substrates, such as semiconductor substrates and semiconductor device components, and include systems for accurately positioning the fabricated structures, supporting and handling the fabrication substrates, and cleaning excess and residual material from the fabrication substrates.

In the construction of semiconductor devices and the like, apertures may be formed into or through the object for various reasons. For example, apertures known as "via holes" may be formed in various components of an electronic device for the purpose of forming electrical conductors, or "vias," that extend within the aperture, typically in a direction which is generally perpendicular to a plane in which a surface of the component is located. Where the component itself is electrically conductive, the via must be insulated from the component to avoid short-circuiting. In state-of-the-art semiconductor devices, the vias are formed to have a very small diameter, generally about 17 μm to about 150 μm. In some cases, the via hole length is significantly greater than the diameter thereof, whereby the hole is said to have a high aspect ratio. While higher circuit densities are possible where the via hole diameter is very small, suitably filling high aspect ratio via holes with a conductive metal is difficult.

Where a via is to be formed in a semiconductive material, such as silicon, gallium arsenide, or indium phosphide, or a conductive material, such as a metal, a first or precursor hole is typically formed by a so-called "trepan" process, whereby a very small bit of a router or drill, a laser beam or other energy beam, or the like is moved in circular paths of increased distance to create the precursor hole. The precursor hole is larger in diameter than the desired completed via to be formed. Following precursor hole formation, a thin silicon oxide or other insulating layer is formed on the inner surface of the hole by exposure of the inner surface to an oxidizing atmosphere. When a polymeric insulative coating is desired, a thin oxide layer may be formed prior to vapor depositing a suitable polymer, such as parylene resin, over the substrate and within each precursor hole. Oxidation or adhesion promotion of the inner surfaces of the precursor hole is required because adhesion of polymer directly to silicon is relatively poor compared to adhesion to an oxide or adhesion promoter. A negative pressure (e.g., a vacuum) may be applied to an end of each precursor hole to draw the polymer therein. The polymer is then cured or otherwise hardened or permitted to harden. Next, a small via hole of desired diameter is drilled (e.g., by percussion drill or continuous laser) or otherwise formed in the hardened polymer. The via hole is then filled with a conductive material, such as conductively doped polysilicon, a metal, a metal alloy, or a conductive or conductor-filled elastomer, to form a via that provides a conductive path through the via hole, which conductive path may extend between opposed surfaces of the substrate. The polymer insulates the conductive via from the substrate.

The steps taken in the prior art to form a via in a semiconductive or conductive substrate are depicted in the flowchart of FIG. 1. A substrate, such as a full or partial silicon wafer, is subjected to a first hole-forming process, at reference character 10. The first hole-forming process may be effected by a laser, drill, or router in a so-called "trepan" process, in which a bit of the drill or router is rotated and moved laterally along a plurality of circular paths of increasing diameter to form a precursor hole of a desired diameter, which is greater than the desired diameter for the final via hole. The substrate is then cleaned to remove any debris, as indicated at reference character 11.

Next, as shown at reference character 12, the substrate is then exposed to a passivating (e.g., oxidizing or nitridating) atmosphere to passivate the inner surfaces of the precursor hole. For example, silicon may be oxidized to form silicon dioxide, nitridated to form a silicon nitride, or otherwise passivated to form a silicon oxynitride, all as known in the art. Passivation is useful for providing an adhesion base for an insulative polymer since the adhesion of many polymers to various materials, including unoxidized silicon, may be poor.

Next, at reference character 14, an insulative resin polymer is deposited in the precursor hole, such as by a chemical vapor deposition (CVD) technique or in a dissolved, atomized form. A pressure may be required to force the polymer into the precursor hole. Typically, the precursor hole is completely filled with polymer. In addition, the polymeric resin forms a coating over the exposed major surfaces of the substrate, from which it must be cleaned.

The substrate is then subjected to thermal curing, as indicated at reference character 16, to cure and, thus, solidify the polymer within the precursor hole. Then, at reference character 18, the substrate surfaces are cleaned of polymer. In addition, the chamber in which the insulative coating is formed (e.g., a CVD chamber) requires cleaning of polymer and polymer condensation products from its interior surfaces. At reference character 20, a final via hole is formed through the hardened polymer by a small diameter drill such as a laser drill.

After cleaning debris from the substrate following the drilling process, as indicated at reference character 21, the final via hole is filled with a conductive material, as shown at reference character 22. The conductive material forms the conductive via between opposite surfaces of the substrate.

When the substrate in which the via hole and via are formed comprises a different type of material, such as the resin of a printed circuit board (PCB), for example, the surface oxidation step may not be required to increase adhesion of the via hole-lining polymer to the surface of the via hole.

Inasmuch as most semiconductor devices are formed as part of a multicomponent substrate, it is advantageous to form vias in such devices prior to separation (e.g., by use of a singulation saw) of the devices from the wafer.

Current methods of forming vias in conductive or semiconductive materials are time-consuming, are cumbersome, and waste resin. Thus, application and curing of the parylene resin or other nonconductive polymer creates a solid layer over the entire substrate, and the walls and other surfaces within the application chamber become covered with the polymer and pyrolysis products thereof. Thus, the substrate and the chamber require extensive cleaning.

Moreover, parylene resin is relatively expensive. Nonetheless, a majority of the applied parylene resin is not applied to the surfaces of the via holes, where application is actually desired, but is deposited onto surfaces from which it will subsequently be removed, then discarded.

Accordingly, there is a need for an improved method for lining the surfaces of via holes with electrically insulative materials, particularly via holes that have been formed in substrates which comprise semiconductive or conductive materials.

SUMMARY OF THE INVENTION

The present invention includes methods which incorporate stereolithography for fabricating insulative coatings, including polymeric insulative coatings, on inner surfaces of via holes in substrates of electronic apparatus and the like, including semiconductor device components such as semiconductor devices, interposers, other carrier substrates, and other components configured for use with semiconductor devices. Devices and components in which conductive vias are to be formed are identified herein as "substrates" regardless of the purpose of the via or material of construction. Thus, for example, the term "substrate" is inclusive of wafers, semiconductor devices, semiconductor substrates (e.g., full or partial wafers of semiconductive material, silicon-on-insulator (SOI) type substrates, such as silicon-on-ceramic (SOC), silicon-on-glass (SOG), and silicon-on-sapphire (SOS), etc.), interposers, and circuit boards. In addition to methods for forming insulative coatings for via holes, the present invention includes via holes and vias so formed, as well as semiconductor device components that include such via holes and vias.

An exemplary stereolithography apparatus useful in the present invention includes a fabrication tank in which a substrate(s) may be supported on a suitable platen or other support system, and upon which a structure(s) may be stereolithographically formed by irradiating or otherwise supplying energy to at least a surface of a quantity of consolidatable, unconsolidated material (e.g., a photopolymer), thereby causing the material to become least partially consolidated (e.g., enter a semisolid state). The fabrication tank may include a reservoir that is configured to hold a volume of unconsolidated material, such as a liquid polymer.

A material consolidation system is associated with the fabrication tank in such a way as to direct consolidating energy (e.g., in the form of radiation, such as a focused laser beam or less focused radiation) to one or more desired locations on a surface of the quantity of unconsolidated material within the reservoir of the fabrication tank. When selective consolidation is desired, a high level of precision may be achieved when the consolidating energy is focused and the surface of the quantity of unconsolidated material and the focal point for the consolidating energy substantially intersect one another.

Optionally, a stereolithography apparatus useful in the present invention includes a machine vision system with a controller for detecting the two-dimensional or three-dimensional location of a substrate or a feature on the substrate, such as a precursor hole or other aperture therein, and directing the consolidation system and substrate support system to form a three-dimensional annular structure containing the via hole. Other subsystems of the stereolithography apparatus may comprise components for cleaning the substrate, reclaiming and reusing the unconsolidated material, and controlling the entire process for continuous or semicontinuous automation.

A method according to the present invention includes forming one or more precursor holes at least partially through specified locations of a substrate with opposite first and second surfaces. The precursor hole includes an inner surface and a central axis, which may extend from the first surface to the second surface of the substrate. Any suitable method may be used to form the precursor hole. An exemplary method includes use of a tool, such as a router, mechanical drill, or laser drill, to effect a trepanning process. The precursor hole may be cylindrical in shape, somewhat conical in shape, or have an hourglass shape or a bulging center section.

Where the substrate comprises a semiconductive material, like silicon, the surface of the precursor hole may be exposed to an oxidizing atmosphere before proceeding to use of a stereolithography technique to line the via hole with an electrically insulative coating.

In a stereolithography method for forming insulative coatings within via holes, a portion of the precursor hole is filled with a thin layer of unconsolidated material (e.g., in liquid or particulate form), such as a flowable photopolymer, a resin-covered particulate material, or another suitable unconsolidated material. The precursor hole is filled to a predetermined depth with the unconsolidated material, forming a layer which may have a thickness of from about 2 μm to about 75 μm and having an upper surface. The layer may be formed by immersing the substrate in a quantity of unconsolidated material, by injecting a controlled volume of the unconsolidated material into the hole from above, or by other suitable techniques.

A preselected annular portion of the thin layer of unconsolidated material in the precursor hole is then exposed to consolidating energy to selectively consolidate an annular portion of the same to at least a semisolid state and to bond material within the annular portion to the internal surface of the precursor hole, thereby forming an insulative coating within the precursor hole. The nonirradiated central portion of the insulative coating comprises a via hole. The steps of forming a layer and irradiating the layer may be repeated as many times as necessary to complete the insulative coating to the desired vertical dimension. Each successive layer is generally superimposed on and adheres to the underlying insulative coating layer (and to the precursor hole surface) to form a continuous structure which defines a via hole. While a single irradiation step may suffice for very thin substrates (e.g., substrates with thicknesses of less than about 18 mils), a plurality of irradiation steps may be required to form insulative coatings within the precursor holes of thicker substrates. In addition to depending upon the thickness of the substrate, the number of irradiation steps may depend upon the precision required to form an insulative coating and via hole of desired dimensions.

Typically, the "substrate" comprises a multichip wafer or multisubstrate wafer which may contain up to several thousand or more via locations within the outer periphery thereof. Each act in the method is conducted for all precursor holes or via holes in a substrate before the next act is initiated.

When the insulative coating has been formed within each via hole by consolidating (e.g., at least partially curing, bonding material particles, or otherwise hardening) the unconsolidated material, remaining unconsolidated material may be removed from the first and second surfaces of the substrate and from within the via holes, then reclaimed or recycled, if desired. Optionally, the substrate may be cleaned to further remove any residual unconsolidated material therefrom. If required, further curing, hardening, or other consolidation of the insulative coatings may be subsequently completed after removal and/or cleaning of unconsolidated polymer material from the substrate.

As an alternative, each precursor hole may be filled with an insulative material, such as by stereolithography processes, the insulative material at least partially consolidated, then a via hole may be formed through the insulative material, simultaneously forming the insulative coating of the via hole. By way of example only, a laser with a small beam spot may be used to form the via hole through the insulative material.

The process may be conducted with a conventional stereolithography apparatus and may employ a focused beam of energy (e.g., electromagnetic radiation) to achieve at least partial consolidation at precise locations (e.g., within precise boundaries). Via holes with diameters typical of the prior art (e.g., about 17 µm to about 150 µm) or smaller are readily formed. The via holes may be cylindrical in shape, conical in shape, hour glass-shaped, or have any other suitable shape. Conductive material, such as conductively doped polysilicon, a metal, a metal alloy, a conductive or conductor-filled elastomer, or the like, may then be introduced into each via hole (e.g., by CVD, physical vapor deposition (PVD) (e.g., sputtering), plating, dispensing, etc.).

A system according to the present invention includes an aperture-forming element, a dielectric material-introducing element, and a material consolidation element. The inventive system may also include one or both of an unused material-removal element and a conductive material introduction element. The aperture-forming element, which may comprise a router, a mechanical drill, a laser drill, or the like, is configured to form at least one precursor hole or other aperture in a substrate. The dielectric material-introducing element, which may comprise elements of a stereolithographic fabrication tank, a dispense needle, or the like, is configured to introduce unconsolidated dielectric material into the precursor hole or other aperture. The material consolidation element, which may comprise a stereolithographic material consolidation system, is configured to selectively consolidate unconsolidated dielectric material located adjacent to a surface of the precursor hole so as to form an insulative coating on the surface. The unused material-removal element, which may comprise a cleaning element or material reclamation system, is configured to remove and, optionally, reclaim unconsolidated material that remains within the confines of the precursor hole or other aperture, thereby reducing wastage of the unconsolidated material. The conductive material introduction element, which may comprise a PVD chamber, a CVD chamber, a plating bath (e.g., for electrolytic, electroless, or immersion plating), or a liquid dispense needle, is configured to introduce material into a via hole that extends through an insulative coating on the surface of the precursor hole or other aperture.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which depict exemplary embodiments of various features of the present invention:

FIG. 1 is a flowchart of a typical prior art method for forming vias in a substrate;

FIG. 2 is a flowchart of an exemplary method for forming vias in a substrate in accordance with the invention;

FIG. 4A schematically depicts a stereolithographic fabrication tank which includes a variation of surface level control element, which stereolithographic fabrication tank may be used to effect methods of the present invention;

FIG. 5 is a perspective view of a wafer support platform useful in a method of the invention;

FIG. 5A is a partial, enlarged, cross-sectional view of a wafer support platform in accordance with FIG. 5;

FIG. 6 is a perspective view of another embodiment of a wafer support platform useful in a method of the invention;

FIG. 6A is a partial, enlarged, cross-sectional view of a wafer support platform in accordance with FIG. 6;

DETAILED DESCRIPTION OF THE INVENTION

Figure 3:
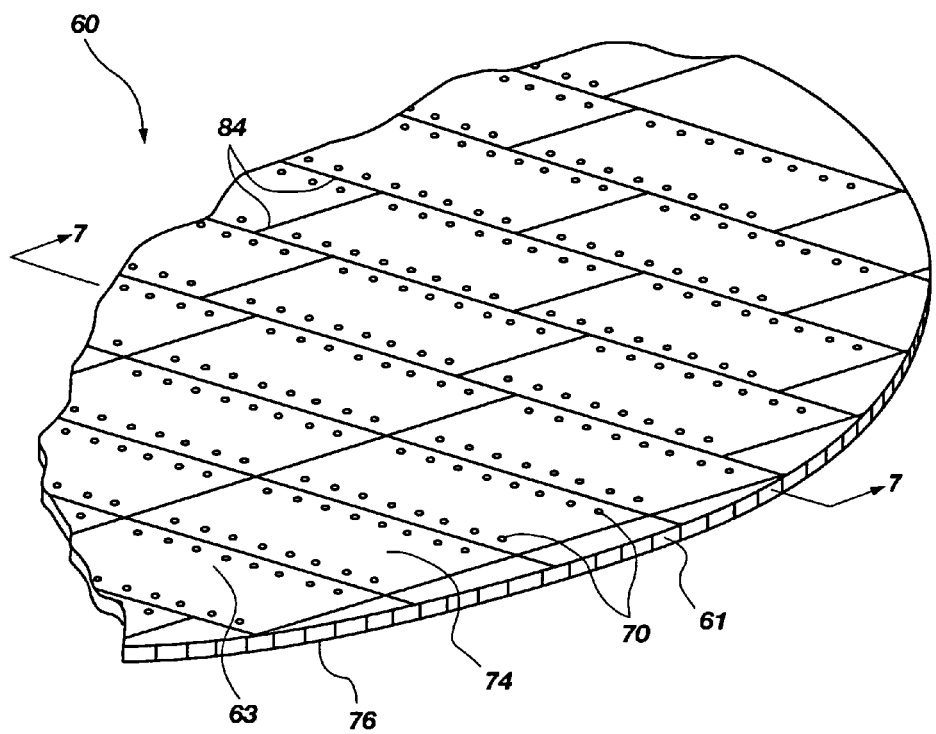
FIG. 3 is a perspective view of a portion of a semiconductor wafer containing via holes formed in accordance with a method of the invention.

Turning now to the present invention, an exemplary method is outlined in FIG. 2 and illustrated in the remaining figures. The method is useful for lining one or more apertures, such as precursors to via holes 50 (FIG. 13), or "precursor holes" 70 (FIG. 8), formed in a substrate 60 with an insulative coating 80 to prevent shorting of conductive vias that are subsequently formed in the via holes 50. As shown in FIG. 3, substrate 60 may be a full or partial wafer of semiconductive material (e.g., silicon, gallium arsenide, indium phosphide), another large-scale substrate, such as an SOI-type substrate, an insulative substrate (e.g., glass, ceramic, etc.), an electrically conductive material, a flexible or rigid circuit board, an individual interposer or collection of individual interposers, an individual semiconductor device or collection of individual semiconductor devices, or the like. The exemplary substrate 60 shown in FIG. 3 comprises a multichip wafer 61 containing many unsingulated semiconductor device components 63, depicted as being dice or chips, that are defined by cut lines, or "streets" 84. Substrate 60 is shown with a first surface 74 and an opposed second surface 76. Surfaces 74 and 76 are typically substantially planar and parallel to one another. As shown, a plurality of precursor holes 70 has been formed through each semiconductor device component 63 of wafer 61 so as to extend at least partially therethrough.

As outlined in FIG. 2 and depicted in FIGS. 7 through 14, the general acts of a method that incorporates teachings of the present invention comprise forming a precursor hole 70 in a substrate 60, at reference character 52 of FIG. 2, and passivating or otherwise forming an adhesion-promoting layer, or insulative coating 80, on the inner surfaces 72 of each precursor hole 70, such as by exposure thereof to an oxidizing or nitridating atmosphere, at reference character 54 of FIG. 2. Such adhesion promotion is particularly useful when substrate 60 is formed from a semiconductive material, a conductive material, or another material to which a polymeric material that has been selected for further passivation of inner surfaces 72 will not adequately adhere.

In a stereolithographic process, at reference character 56 of FIG. 2, a stereolithographic apparatus 98 is used to form a solid or semisolid insulative coating 80 by selectively consolidating one or more successive layers of unconsolidated material 78 that has been introduced into each precursor hole 70. Insulative coating 80 is formed from an unconsolidated material 78 such as a photopolymeric resin, resin-coated particulate material, or other material which may be consolidated by an energy beam, such as the illustrated laser beam 220A, which may comprise electromagnetic radiation of a selected wavelength or range of wavelengths, or an electron beam or a beam of other energy suitable for at least partially consolidating the selected type of unconsolidated material 78. Photopolymers believed to be suitable for use with a stereolithography apparatus 98 that includes an ultraviolet laser beam 220A include, without limitation, Cibatool SL 5170 and SL 5210 resins for the SLA-250/50HR system, Cibatool SL 5530 resin for the SLA-5000 and SLA-7000 systems of 3D Systems, Inc. of Valencia, Calif., and Cibatool SL 7510 resin for the SLA-7000 system, as well as RPC-800, manufactured by RPC, Ltd. of Marly, Switzerland, a wholly owned subsidiary of 3D Systems.

The stereolithographic process at reference character 56 has a plurality of specific subprocesses, identified at reference characters 64, 66, and 68 of FIG. 2, by which a thin layer of unconsolidated material 78 is introduced into a precursor hole 70 at reference character 64, selected regions of unconsolidated material 78 are exposed to consolidating energy (e.g., irradiated) to an at least semisolid state to form an annular-shaped insulative coating 80 or a layer thereof on inner surfaces 72 of precursor hole 70 at reference character 66, and the layer formation process of reference character 64 and the consolidation process of reference character 66 are repeated at reference character 68 as many times as necessary to complete the insulative coating 80. Once unconsolidated material 78 within each precursor hole 70 has been selectively consolidated, the resulting insulative coating 80 defines an aperture of a completed via hole 90 of desired dimensions which extends through substrate 60.

Two examples of the manner in which a layer of unconsolidated material 78 may be formed in precursor holes 70 are described herein.

One example is illustrated in FIGS. 7 through 11, wherein a substrate 60 having precursor holes 70 formed substantially therethrough is secured to a support element 134 so that the lower ends 86 of precursor holes 70 are sealed against an upper support surface 150 of support element 134. A seal element 94 may optionally comprise and/or be carried by upper support surface 150 (see FIG. 7). A quantity of unconsolidated material 78 is shown as being injected from a dispense needle, represented at reference character 156, into each precursor hole 70 to a desired depth or thickness 126A, wherein unconsolidated material 78 has an upper surface 128A. The dispense needle 156 is movable in multiple directions, shown by arrows 162, to dispense unconsolidated material 78 into each precursor hole 70 of substrate 60.

Alternatively, an apparatus which includes multiple dispense needles (not shown) may be used to simultaneously dispense unconsolidated material 78 into a plurality of precursor holes 70. As an alternative to the use of dispense needles 156, unconsolidated material 78 may be introduced into each precursor hole 70 by way of one or more spray nozzles, which are also represented by reference character 156.

As another alternative, a wave of unconsolidated material 78 may be directed over substrate 60, with some unconsolidated material 78 entering precursor holes 70. Excess unconsolidated material 78 may then be removed from the surface of substrate 60, as well as from precursor holes 70, by way of a vacuum system, which could apply a vacuum through one or more dispense needles, which are also represented by reference character 156.

Figure 8:
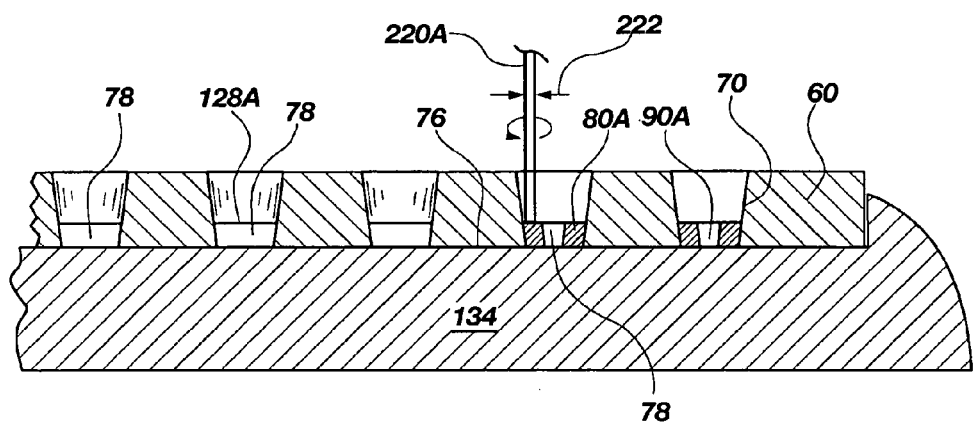
FIG. 8 is an enlarged cross-sectional view of a wafer mounted on a support element illustrating consolidation of a first level of unconsolidated material within a precursor hole to form an insulative coating in accordance with the invention.

An example of the manner in which portions of unconsolidated material 78 may be at least partially consolidated is illustrated in exemplary FIG. 8. Portions of upper surfaces 128A of unconsolidated material 78 in precursor holes 70 of substrate 60 are irradiated with a movable laser beam 220A to at least partially consolidate unconsolidated material 78 into an at least semisolid state, thereby forming a layer 80A of each insulative coating 80. The movement of laser beam 220A may be controlled by controller 700 (see FIG. 4) to impart layer 80A with a desired shape (e.g., cylindrical, frustoconical, etc.). A nonirradiated portion in each layer 80A of each insulative coating 80 comprises a portion of a corresponding via hole 90 (see FIG. 12), which is initially filled with unconsolidated material 78.

It should be noted that where the substrate 60 is relatively thin, it may be possible to complete the insulative coating 80 and enclosed via hole 90 in a single pass of the laser beam 220A. Substrates 60 of greater thickness may require two or more passes of the laser beam 220A over two or more corresponding layers of unconsolidated material 78 to form two or more layers 80A, 80B, etc., and, thus, to complete the insulative coating 80. In forming a multilayer insulative coating 80, the layer thicknesses 126A, 126B . . . 126n may differ from one another.

Figure 7:
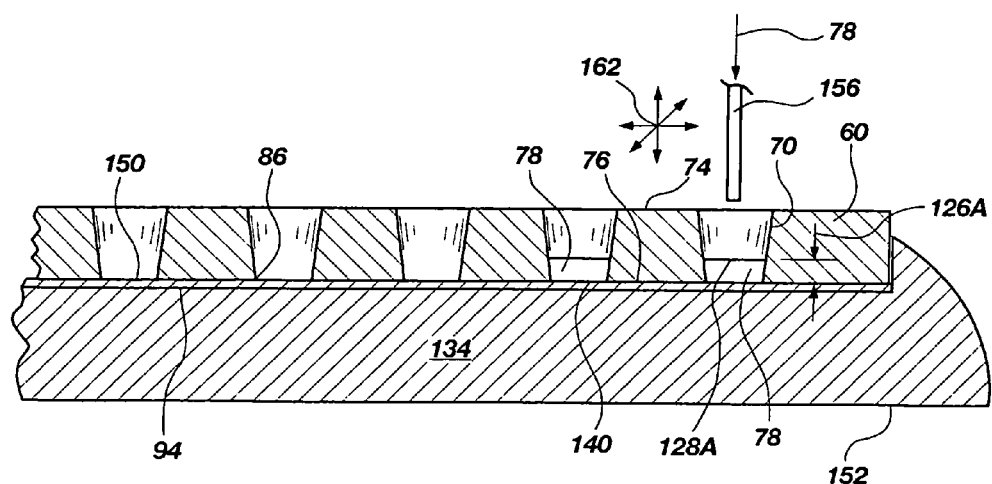
FIG. 7 is an enlarged cross-sectional view of a wafer mounted on a support element and having precursor holes into which a first level of unconsolidated material is being injected or otherwise introduced prior to selective consolidation thereof in accordance with an exemplary embodiment of the invention.
Figure 9:
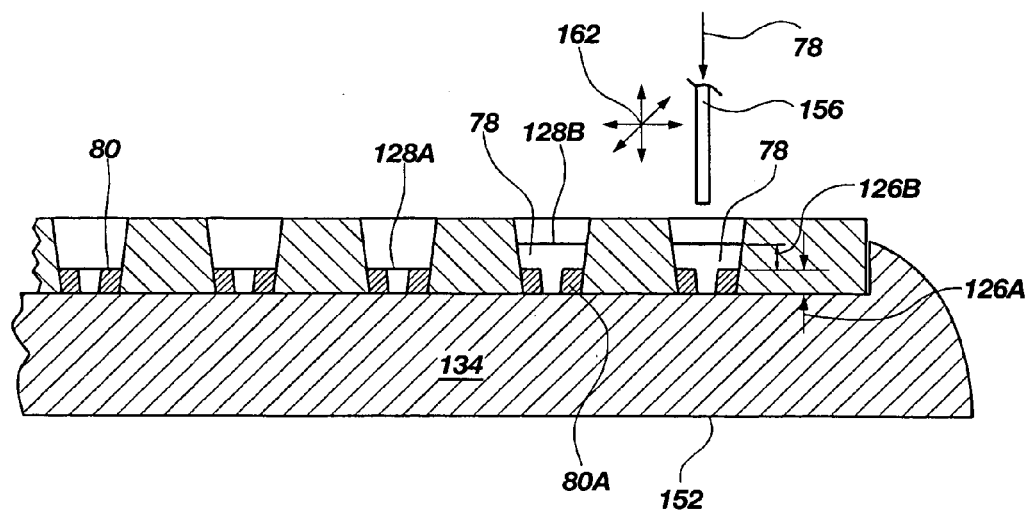
FIG. 9 is an enlarged cross-sectional view of a wafer mounted on a support element illustrating injection or other introduction of unconsolidated material into a precursor hole for formation of a subsequent layer of the insulative coating on a previously formed, at least partially consolidated layer of the insulative coating shown in FIG. 8.
Figure 10:
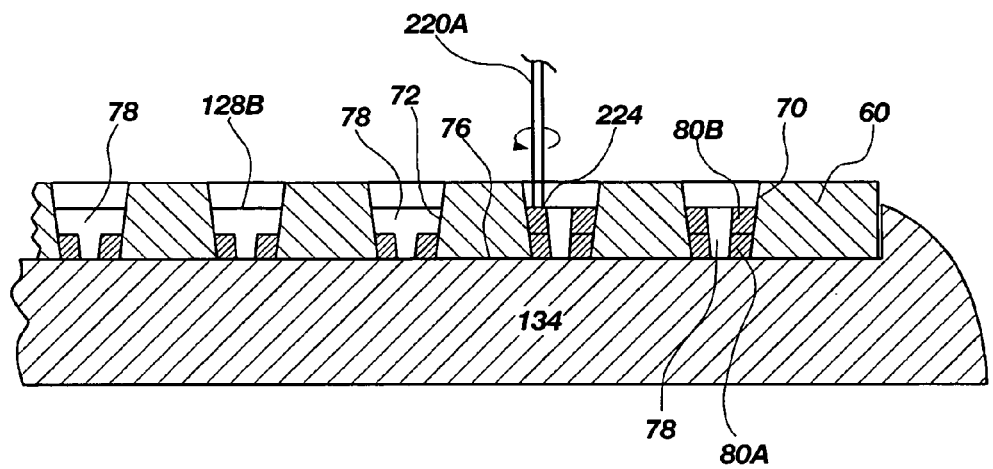
FIG. 10 is an enlarged cross-sectional view of a substrate, in this case a wafer, illustrating at least partial consolidation of material within the uppermost layer shown in FIG. 9 to extend the insulative coating and via hole upwardly within the precursor hole.

As shown in FIGS. 9 and 10, where a plurality of passes is required, the processes of FIGS. 7 and 8 are repeated at a second level 128B. In FIG. 9, unconsolidated material 78 is introduced into each precursor hole 70 at a desired depth or thickness 126A, 126B, etc., above the consolidated upper surface 128A of insulative coating 80A. The quantity of unconsolidated material 78 dispersed into each precursor hole 70 will depend upon the shape of the precursor hole 70, the desired shape of the via hole 90 and the desired layer thickness 126B. In FIG. 10, a second consolidation process is effected. A selected portion of the unconsolidated material 78 dispensed into the precursor holes 70 is consolidated by irradiation with laser beam 220A whereby the unconsolidated material 78 is at least partially consolidated and adheres to both the underlying consolidated layer 80A and the inner surface 72 of the precursor hole 70.

Figure 11:
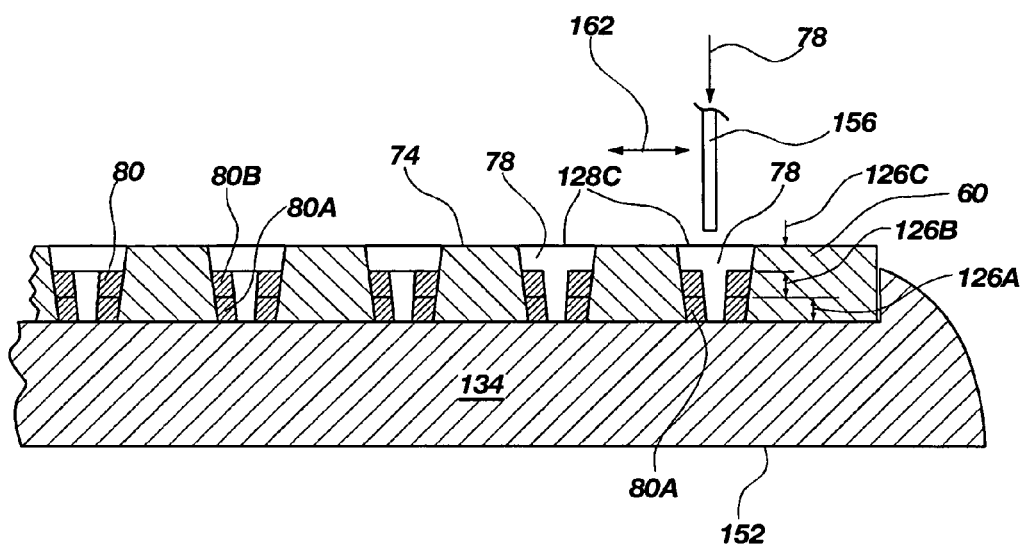
FIG. 11 is an enlarged cross-sectional view of a wafer mounted on a support element illustrating injection or other introduction of unconsolidated material to form a final, uppermost layer over prior layers of the insulative coating.

FIG. 11 depicts the formation of a final (i.e., upper) layer of an insulative coating 80 in accordance with the invention. In the example shown, the upper surface 128C of insulative coating 80 is substantially coplanar with the first surface 74 of the substrate 60. However, the upper surface 128C of unconsolidated material 78 may alternatively be configured to be recessed relative to first surface 74 or to protrude therefrom, depending upon the configuration of conductors on first surface 74 or within the substrate 60.

Figure 12:
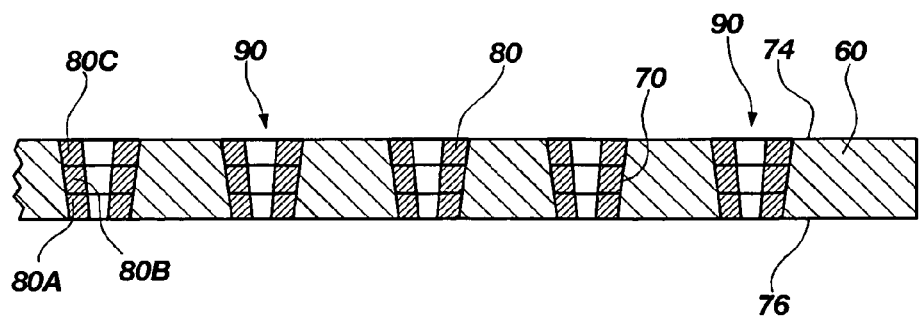
FIG. 12 is an enlarged cross-sectional view of a substrate, showing insulative coatings that include a plurality of layers within the precursor holes.

Following formation of a complete insulative coating 80 and its corresponding via hole 90, remaining unconsolidated material 78 is removed from the substrate 60, including from the via holes 90, as shown at reference character 58 of FIG. 2. In addition, the substrate 60 may be cleaned. The completed substrate 60, which is depicted as having three-layered insulative coatings 80, is illustrated in FIG. 12. The recovered unconsolidated material 78 may be reused.

Figure 13:
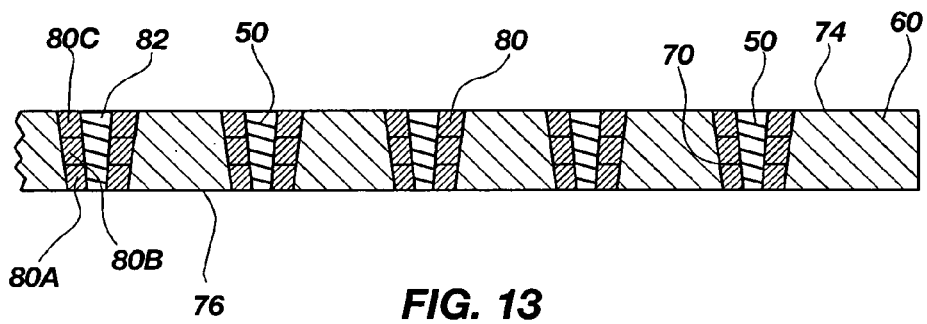
FIG. 13 is an enlarged cross-sectional view of the substrate of FIG. 12, including vias formed from conductive material within the insulator-coated precursor holes thereof.

Thereafter, a conductive material 82 (e.g., polysilicon, a metal, a metal alloy, a conductive or conductor-filled elastomer, etc.) may be introduced into each via hole 90, as known in the art (e.g., by known deposition processes (e.g., PVD, CVD, electrolytic, electroless, or immersion plating processes, etc.), with a dispense needle, etc.), to complete the formation of the vias 50, as indicated at reference character 62 in FIG. 2. Such a structure is depicted in FIG. 13.

Figure 4:
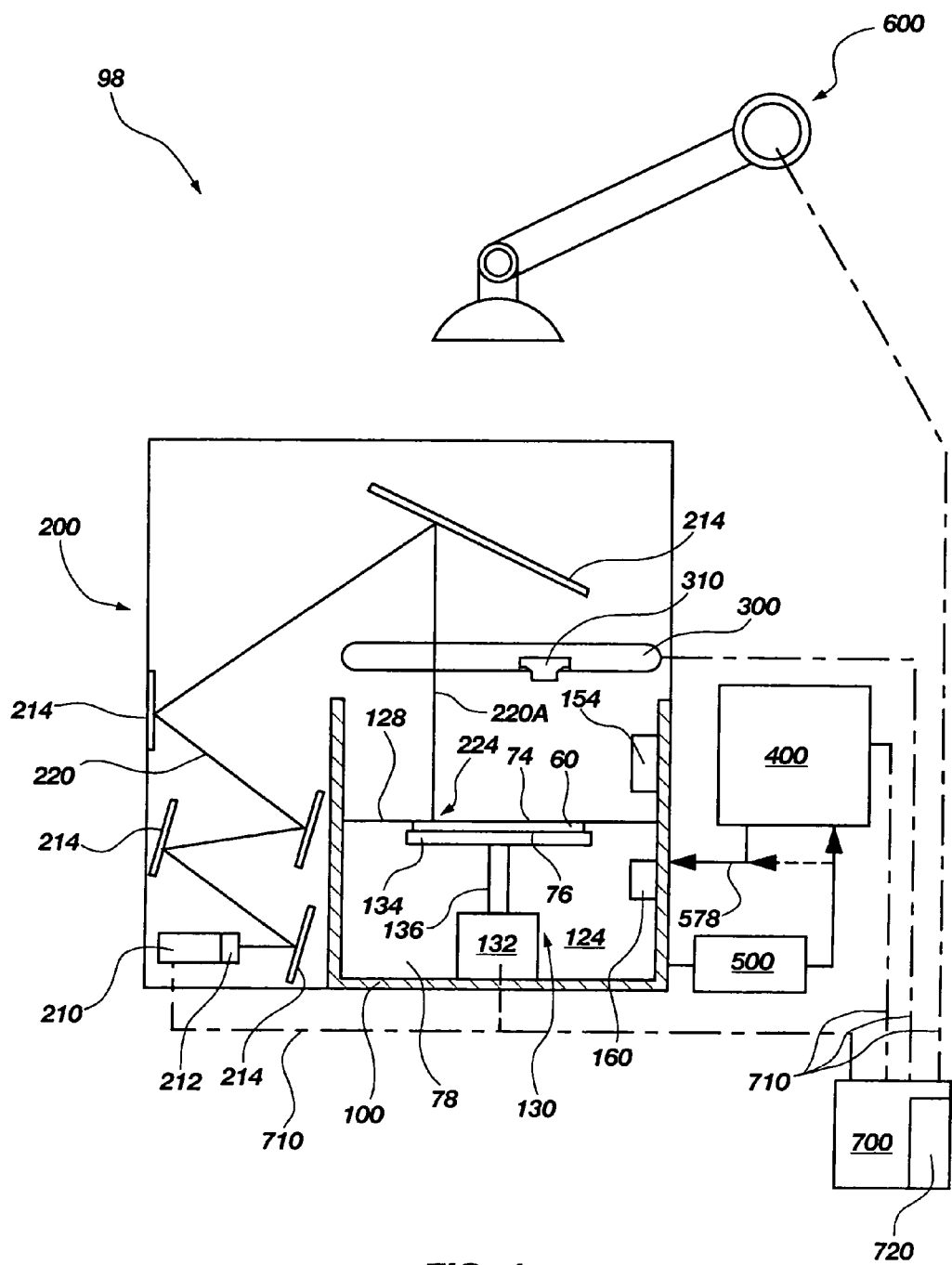
FIG. 4 is a schematic representation of various possible elements of an exemplary stereolithography apparatus that may be used to fabricate features including insulative polymeric coatings for via holes in substrates, such as semiconductor device components, in accordance with the present invention.

An exemplary stereolithographic apparatus 98 for use in fabricating vias 50 on substrates 60 is schematically depicted in FIG. 4. The preferred, basic stereolithography apparatus 98 for implementation of the method of the instant invention, as well as operation of such apparatus, is described in great detail in United States Patents assigned to 3D Systems, Corp. of Rock Hill, S.C., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated in its entirety by this reference.

Stereolithographic apparatus 98 includes a fabrication tank 100, as well as a material consolidation system 200, a machine vision system 300, a cleaning component 400, and a material reclamation system 500 that are associated with fabrication tank 100. The depicted stereolithographic apparatus 98 also includes a substrate handling system 600, such as a rotary feed system or linear feed system available from Genmark Automation Inc. of Sunnyvale, Calif., for moving substrates 60 to and from a system of stereolithographic apparatus 98. Features of one or more of the foregoing systems may be associated with one or more controllers 700, such as computer processors or smaller groups of logic circuits, in such a way as to effect their operation in a desired manner.

Controller 700 may comprise a computer or a computer processor 720, such as a so-called "microprocessor," which may be programmed to effect a number of different functions. Alternatively, controller 700 may be programmed to effect a specific set of related functions or even a single function. Each controller 700 of stereolithographic apparatus 98 may be associated with a single system thereof or a plurality of systems so as to orchestrate the operation of such systems relative to one another.

With regard to controller 700, a 3-D CAD drawing of substrate 60 with an object, such as an insulative coating 80, to be fabricated is placed, in the form of a data file, in the memory of a computer processor 720 controlling the operation of apparatus 98 if computer processor 720 is not under control of a CAD program by which the original object design was effected. In other words, an object design may be effected in a first computer in an engineering or research facility and the data files transferred to computer processor 720 of apparatus 98 for fabrication of the insulative coatings 80. The data is preferably formatted in an STL (for STereoLithography) file, STL being a standardized format employed by most manufacturers of stereolithography equipment. In an STL file, the boundary surfaces of an object (e.g., insulative coating 80) are defined as a mesh of interconnected triangles.

Fabrication tank 100 (or a chamber within the tank) is configured to contain a support system 130. In turn, support system 130 is configured to carry one or more fabrication substrates 60. By way of example only, the types of substrates 60 that support system 130 may be configured to carry may include, without limitation, a bulk semiconductor substrate (e.g., a full or partial wafer 61 of semiconductive material, such as silicon, gallium arsenide, indium phosphide, a silicon-on-insulator (SOI) type substrate, such as silicon-on-ceramic (SOC), silicon-on-glass (SOG), or silicon-on-sapphire (SOS), etc.) that includes a plurality of semiconductor device components 63 thereon (See FIG. 3).

Fabrication tank 100 may communicate with a reservoir (not shown) from which unconsolidated material 78 may be drawn to flow into the fabrication tank. Such unconsolidated material 78 may comprise, for example, a photoimageable polymer, or "photopolymer," particles of thermoplastic polymer, resin-coated particles, or the like.

The fabrication tank 100, support system 130 and controller 700 may be configured to automatically maintain a precise, constant level of surface 128 of a portion of volume 124 of unconsolidated material 78 located within the tank 100 (or chamber therein). Thus, an object, such as insulative coating 80, may be formed in a thin layer of unconsolidated material 78 by consolidating energy 220.

A material consolidation system 200 is associated with fabrication tank 100 in such a way as to direct consolidating energy 220 into fabrication tank 100, toward at least areas of surface 128 of volume 124 of unconsolidated material 78 within fabrication tank 100 that are located within precursor holes 70 in substrate 60. Material consolidation system 200 includes a source 210 of consolidating energy 220. If consolidating energy 220 is focused, source 210 or a location control element 212 associated therewith (e.g., a set of galvanometers, including one for x-axis movement and another for y-axis movement) may be configured to direct, or position, consolidating energy 220 toward a plurality of desired areas of surface 128. Alternatively, if consolidating energy 220 remains relatively unfocused, it may be directed generally toward surface 128 from a single, fixed location or from a plurality of different locations. In any event, operation of source 210, as well as movement thereof, if any, may be effected under the direction of controller 700. A currently preferred energy source 210 is a laser generator which creates a laser beam 220A which is precisely focusable by a series of mirrors 214 at a focus point 224 in or on a selected portion of surface 128 to be consolidated. A focused energy beam (e.g., laser beam 220A) having a "spot" diameter 222 (see FIG. 8) of up to about 130 µm or even larger may be used to form insulative coatings 80 in accordance with teachings of the present invention. Beam diameters 222 of less than about 50 µm and as small as about 17 µm may also be used to form insulative coatings 80 through which via holes 90 having diameters of about 17 µm to about 150 µm extend. It is currently preferred that, when laser beam 220A is moved across surface 128 (i.e., in the X-Y plane), the resolution of laser beam 220A be about 8 µm over at least a 0.5 inch×0.25 inch field from a predetermined center point on surface 128, thereby providing a high resolution scan across an area of at least 1.0 inch×0.5 inch. Of course, it is desirable to have substantially this high a resolution across the entirety of surface 128 to be scanned by laser beam 220A, such area being termed the "field of exposure." A laser wavelength, typically UV, is selected to provide rapid consolidation of the particular photopolymeric material within a precisely defined region.

When material consolidation system 200 directs focused consolidating energy 220 toward surface 128 of volume 124 of unconsolidated material 78, stereolithographic apparatus 98 may also include a machine vision system 300. Machine vision system 300 facilitates the direction of focused consolidating energy 220 toward desired locations of features (e.g., the locations within precursor holes 70 at which insulative coatings 80 are to be formed) on substrate 60. As with material consolidation system 200, operation of machine vision system 300 may be prescribed by controller 700. If any portion of machine vision system 300, such as a camera 310 thereof, moves relative to fabrication tank 100, that portion of machine vision system 300 may be positioned so as provide a clear path to all of the locations of surface 128 that are located on each substrate 60 within fabrication tank 100.

It is understood that the material consolidation system 200 may also be configured to fabricate other features on the substrate 60 in addition to the insulative coatings 80 through which via holes 90 extend. Optionally, one or both of material consolidation system 200 and machine vision system 300 may be oriented and configured to operate in association with a plurality of fabrication tanks 100 or reservoirs therein, each used for fabrication of a desired feature. The controller 700 is then configured for orchestrating the operation of material consolidation system 200, machine vision system 300, and substrate handling system 600 relative to a plurality of fabrication tanks 100.

Cleaning component 400 of stereolithographic apparatus 98 may also operate under the direction of controller 700. Cleaning component 400 of stereolithographic apparatus 98 may be continuous with fabrication tank 100 or positioned adjacent thereto to clean unconsolidated material 78 from the substrate 60. If cleaning component 400 is continuous with fabrication tank 100, any unconsolidated material 78 that remains on a substrate 60 may be removed therefrom prior to introduction of another substrate 60 into fabrication tank 100.

If cleaning component 400 is positioned adjacent to fabrication tank 100, residual unconsolidated material 78 may be removed from a substrate 60 as it is being moved from fabrication tank 100 (or from one of several chambers thereof). Alternatively, any unconsolidated material 78 remaining on substrate 60 may be removed therefrom after the substrate has been removed from fabrication tank 100, in which case the cleaning process may occur as another substrate 60 is positioned within fabrication tank 100 (or chamber thereof).

Material reclamation system 500 collects excess unconsolidated material 578 that has been removed from a substrate 60 by cleaning component 400, then returns excess unconsolidated material 578 to the fabrication tank 100 or a reservoir (not shown) which is associated with fabrication tank 100 for maintaining a desired level, or elevation, of surface 128.

Referring again to FIG. 7, substrate 60 may be carried upon a support element 134 which is held in a fixed position as a controlled volume of unconsolidated material 78 is introduced, by a dispense needle 156, into each precursor hole 70. Of course, dispense needle 156 communicates with a source (not shown) of unconsolidated material 78. As illustrated by arrows 162, dispense needle 156 moves along at least three axes, thereby facilitating positioning thereof over or within each precursor hole 70 without contacting first surface 74 of substrate 60. The operation and movement of dispense needle 156 may be under control of controller 700. Multiple levels of injections, with intervening consolidation steps, are required to form a multilayer insulative coating 80.

Alternatively, as shown in FIG. 4, a substrate support system 130 supports and maintains a substrate 60 at a desired elevation within fabrication tank 100. The support system 130 includes a support element 134 upon which a substrate 60 is positioned. A motorized actuation element 132 moves support element 134 through a positioning element 136. Such movement may be vertical, for controlling the level of unconsolidated material 78 (See FIG. 12) within the precursor holes 70 of substrate 60, and may also be rotatory about a vertical axis 138 (FIG. 5) to rotationally position a substrate 60. Additionally, rotational movement of a substrate 60 at a relatively high RPM will provide a cleaning action to remove unconsolidated material 78 as well as other substances from the substrate.

FIGS. 5 and 5A depict another exemplary type of a support element 134' which may be used. The support element 134' has a flat support surface 150 and a peripheral edge 92, which are shown as configured for a full wafer, but may be adapted for use in supporting a partial wafer, single semiconductor device, or other full or partial fabrication substrate 60. In this embodiment, support surface 150 of support element 134' is sealable against the second surface 76 of substrate 60.

Figure 14:
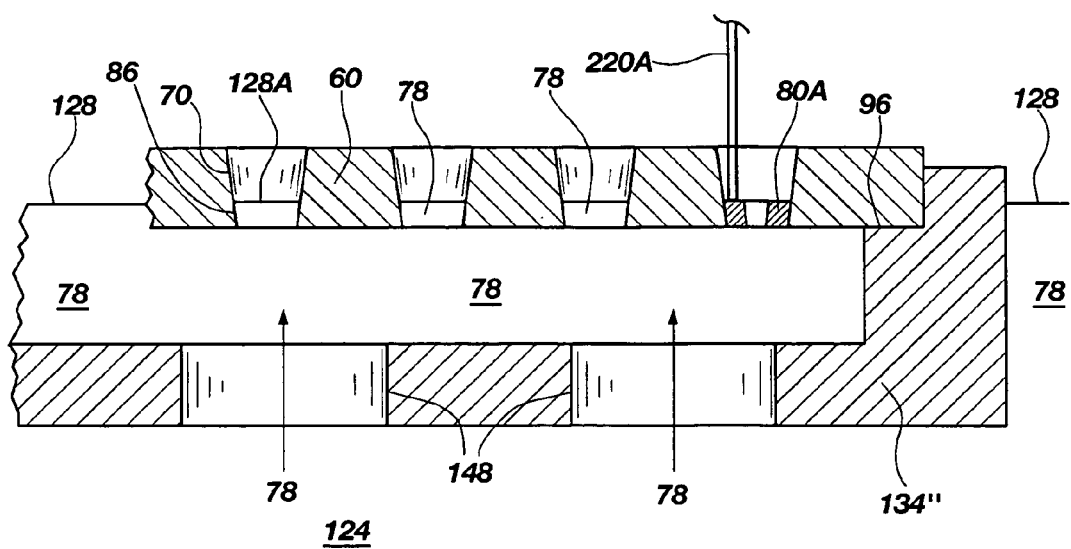
FIG. 14 is an enlarged cross-sectional view of a wafer mounted on another support element, such as that shown in FIGS. 6 and 6A, by which unconsolidated material flows upwardly into precursor holes to a controlled level and consolidated into a hardened via hole-defining insulative coating in accordance with another embodiment of the invention.

FIGS. 6, 6A, and 14 depict yet another exemplary type of support element 134". In this embodiment, a step 96 encircles the inside of the peripheral edge 92 for supporting the edge of a substrate 60, such as a wafer 61. As supported, the substrate 60 is spaced from the perforated support surface 150. One or more perforations 148 permit flow of unconsolidated material 78 into the lower ends 86 of the precursor holes 70 and subsequently into the lower openings of the via holes 90 (FIG. 12). The desired surface 128 level of volume 124 of unconsolidated material 78 may be achieved by either moving material surface 128 level upward (e.g., by adding unconsolidated material 78 to fabrication tank 100) or displacing unconsolidated material 78 within fabrication tank 100 (e.g., by submersing the support element 134" and attached substrate 60 downward into the unconsolidated material 78), or by a combination of the foregoing techniques.

As shown in FIG. 4, a positioning element 136 is depicted as being secured to the lower surface 152 of the support element 134 and as being associated with an actuation element 132, by which positioning element 136 is moved vertically (and, optionally, rotationally) to position a substrate 60 for stereolithographic fabrication of insulative coatings 80 on inner surfaces 72 of precursor holes 70 of substrate 60. By way of example only, positioning element 136 may comprise a hydraulically or pneumatically actuated piston, a screw, a linear actuator or stepper element, a series of gears, or the like. Alternatively, the support element 134 may be laterally supported. Actuation element 132 is, of course, associated with and configured to effect movement of positioning element 136. Accordingly, examples of actuation elements 132 that may be used as part of support system 130 include, but are not limited to, hydraulic actuators, pneumatic actuators, screw-drive motors, stepper motors, and other known actuation means for controlling the movement of positioning element 136 in such a way as to cause support element 134 to move from one elevation to another in a substantially vertical direction and with a higher degree of dimensional precision. Additionally, positioning element 136 and actuation element 132 may elevate support element 134 and, thus, each fabrication substrate 60 thereon out of the support element cavity 146 (FIGS. 5A, 6A) to facilitate movement of each fabrication substrate 60 by substrate handling system 600 (FIGS. 1 and 2). Alternatively, the level at which surface 128 of volume 124 of unconsolidated material 78 is located may be lowered below support surface 150.

Control over the operation of actuation element 132 and, thus, over the movement of positioning element 136 and elevation of support element 134 may be provided by a processing element such as controller 700 or a separate processor dedicated for use with support system 130 or tank 100, in communication therewith, either as a part of tank 100 or, more generally, as a part of the stereolithographic apparatus 98.

A surface level control element 154 may be configured to maintain surface 128 of volume 124 of unconsolidated material 78 at a substantially constant elevation. Surface level control element 154 may comprise a level sensor and an element for adjusting volume 124 of unconsolidated material 78. The surface level of unconsolidated material 78 is monitored and facilitates adjustment or displacement of volume 124 to change the elevation of surface 128 and thereby maintain surface 128 at a substantially constant elevation. Such control is known in the art.

Alternatively, as shown in FIG. 4A, a surface level control element 154' may include one or more apertures or other openings 102 in a side wall 101 of tank 100' that have lower edges 103 that are positioned at an elevation within tank 100' at which surface 128 of volume 124 of unconsolidated material 78 is to be maintained. In addition, surface level control element 154' includes one or more receptacles 104 that communicate with openings 102 to receive overflowing unconsolidated material 78 as support element 134 and a workpiece, if any, thereon, as well as stereolithographically fabricated objects, are lowered into tank 100' and displace unconsolidated material 78 therein. A pumping system or other material recycling element 105 may communicate with each receptacle 104 in such a way as to return overflowed unconsolidated material 78 to tank 100' as support element 134 is raised to facilitate stereolithographic fabrication of one or more other objects.

The introduction of support element 134 or one or more fabrication substrates 60 into a volume 124 of unconsolidated material 78 contained within tank 100 (or a reservoir contained therein) may result in the introduction of gas or air bubbles into unconsolidated material 78. Accordingly, referring again to FIG. 4, fabrication tank 100 may optionally include a bubble elimination system 160 to facilitate the removal of air or gas bubbles (not shown) from unconsolidated material 78. By way of example, bubble elimination system 160 may comprise an ultrasonic transducer of a known type (e.g., a piezoelectric transducer), which causes fabrication tank 100 or support system 130 thereof to vibrate. Vibrations in fabrication tank 100 or support system 130 are transmitted to unconsolidated material 78, causing any bubbles therein to dislodge from a structure to which they are adhered and float to surface 128, where they will pop or may be removed, such as by use of negative pressure. Thus, a desired level of unconsolidated material will be maintained in each precursor hole 70.

It is well known that the resolution of a laser beam 220A that is to be moved may be substantially maintained by keeping the path of laser beam 220A as constant (in this case, vertical) as possible. This may be done by increasing the path length of that laser beam 220A (e.g., to about twelve (12) feet). Nonetheless, it may not be practical for a stereolithographic apparatus 98 that incorporates teachings of the present invention to include a laser beam 220A with a source 210 that is positioned a sufficient distance from surface 128 of volume 124 of unconsolidated material 78 that is to be selectively consolidated by laser beam 220A. Accordingly, laser source 210 may also include a suitable mirror 214 or series of mirrors 214 that results in a nonlinear path for laser beam 220A to provide a desired path length L in a fixed amount of available space. As depicted, the area of mirror 214 may be large enough to substantially cover the entire cone of possible angles at which laser beam 220A may be directed by location control element 212 and, thus, to reflect consolidating energy 220 from every possible direction onto a corresponding location of surface 128 as focused laser beam 220A.

Optionally, or as an alternative to the use of a location control element 212, the position and/or orientation of one or more of mirrors 214 may be moved, such as by a motor controlled by controller 700.

The methods of the present invention provide substantial advantages. First, polymeric materials may be used which are less expensive than parylene resin used in the prior art. Second, there is substantially no wasted polymeric material. While the prior art method forms a layer of parylene resin over the entire substrate surface and application chamber interior (requiring removal), the present method forms hardened material only within a predetermined space within precursor holes. The formed insulative coating structure comprises all of the consolidated material. Unconsolidated resin removed from the substrate is typically reusable. The precision of stereolithography apparatus enables via holes to be formed quickly, accurately and uniformly at the wafer level. In addition, other (non-via) structures may be formed using the same apparatus.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A system for forming conductive vias through substrates, comprising:
    an aperture-forming element configured to form at least one precursor hole in a substrate;
    a dielectric material-introducing element configured to introduce unconsolidated dielectric material into the at least one precursor hole; and
    a material consolidation element configured to selectively consolidate unconsolidated dielectric material located adjacent to a surface of the at least one precursor hole.

2. The system of claim 1, wherein the aperture-forming element comprises at least one of a router, a mechanical drill, and a laser drill.

3. The system of claim 1, wherein the aperture-forming element is configured to effect a trepanning process.

4. The system of claim 1, wherein the dielectric material-introducing element is configured to dispense the unconsolidated dielectric material into the at least one precursor hole.

5. The system of claim 1, wherein the dielectric material-introducing element comprises part of a programmed material consolidation apparatus.

6. The system of claim 5, wherein the part of the programmed material consolidation apparatus comprises a fabrication tank of a stereolithography apparatus.

7. The system of claim 1, wherein the material consolidation element comprises a source of an energy beam.

8. The system of claim 7, wherein the source comprises a laser.

9. The system of claim 8, wherein the laser is configured to generate a UV laser beam.

10. The system of claim 1, further comprising:
    an unused material-removal element configured to remove unconsolidated dielectric material from the at least one precursor hole following use of the material consolidation element.

11. The system of claim 1, further comprising:
    a conductive material introduction element.

12. The system of claim 11, wherein the conductive material introduction element is configured to dispense conductive material into a via hole that extends through an insulative coating formed by selectively consolidated insulative material.

13. The system of claim 11, wherein the conductive material introduction element comprises at least one of a physical vapor deposition chamber, a chemical vapor deposition chamber, an electrolytic plating bath, and an electroless or immersion plating bath.

* * * * *